US009025328B2

(12) United States Patent
Chiang et al.

(10) Patent No.: US 9,025,328 B2
(45) Date of Patent: May 5, 2015

(54) HEAT DISSIPATION MODULE ADAPTED TO AN ELECTRONIC DEVICE AND ELECTRONIC DEVICE THEREWITH

(71) Applicant: Wistron Corporation, New Taipei (TW)

(72) Inventors: Meng-Ting Chiang, New Taipei (TW); Yao-Lung Tsai, New Taipei (TW); Wei-Hsing Wang, New Taipei (TW); Chieu-Tu Cheng, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 267 days.

(21) Appl. No.: 13/727,572

(22) Filed: Dec. 26, 2012

(65) Prior Publication Data

US 2013/0250518 A1 Sep. 26, 2013

(30) Foreign Application Priority Data

Mar. 26, 2012 (TW) .............................. 101205400 U

(51) Int. Cl.
*H05K 5/00* (2006.01)
*H05K 7/00* (2006.01)
*G06F 1/16* (2006.01)
*H05K 7/20* (2006.01)
*G06F 1/20* (2006.01)
*F28D 15/02* (2006.01)
*F28D 21/00* (2006.01)

(52) U.S. Cl.
CPC ............ *H05K 7/20154* (2013.01); *G06F 1/203* (2013.01); *F28D 15/0233* (2013.01); *F28D 2021/0028* (2013.01)

(58) Field of Classification Search
CPC ........... G06F 1/20; G06F 1/203; H01L 23/46; H01L 23/467
USPC ............. 361/679.47, 679.48; 406/65, 66, 100
See application file for complete search history.

(56) References Cited

U.S. PATENT DOCUMENTS

| | | | | |
|---|---|---|---|---|
| 7,212,404 B2 * | 5/2007 | Wang et al | .................... | 361/697 |
| 7,466,548 B2 * | 12/2008 | Ishikawa | ....................... | 361/698 |
| 7,537,049 B2 * | 5/2009 | Cheng et al. | ............. | 165/104.33 |
| 7,778,032 B2 * | 8/2010 | Yang et al. | .................... | 361/697 |
| 8,149,574 B2 * | 4/2012 | Lin | .......................... | 361/679.46 |
| 8,482,916 B2 * | 7/2013 | Wang et al. | ............. | 361/679.47 |
| 8,593,805 B2 * | 11/2013 | Chen | ........................ | 361/679.47 |
| 2004/0257764 A1 * | 12/2004 | Jang | ............................. | 361/687 |
| 2008/0152502 A1 * | 6/2008 | Luo | ........................... | 416/223 R |

* cited by examiner

Primary Examiner — Anthony Haughton
(74) Attorney, Agent, or Firm — Winston Hsu; Scott Margo

(57) ABSTRACT

A heat dissipation module includes a fan and a thermal fin portion. The fan includes a fan body, a plurality of blade units and a plurality of blade extensions. The blade units are connected to the fan body. The blade extensions protrude from the blade units, respectively. A first surface is formed on a side of each of the blade extensions. A distance between the first surface and an axis of the fan body is increasing along an inflow direction. The thermal fin portion includes a plurality of fin units and a plurality of fin extensions respectively protruding from the fin units. A second surface is formed on a side facing the fan extension of each of the fin extension. An identical gap is formed between at least one portion of the first surface and at least one portion of the second surface.

18 Claims, 4 Drawing Sheets

HEAT DISSIPATION MODULE ADAPTED TO AN ELECTRONIC DEVICE AND ELECTRONIC DEVICE THEREWITH

BACKGROUND OF THE INVENTION

1. Field of the Invention

The present invention relates to a heat dissipation module and an electronic device therewith, and more particularly, to a heat dissipation module capable of enhancing heat dissipating efficiency and reducing noise and an electronic device therewith.

2. Description of the Prior Art

Generally speaking, a heat pipe and a heat dissipation module are disposed inside a consumer electronic device. The heat pipe transmits heat generated by internal electronic components the consumer electronic device to thermal fins of the heat dissipation module. Afterwards, a fan of the heat dissipation module flows air to the aforesaid thermal fins, so as to dissipate the heat transmitted to the thermal fins by convection effect.

The dispositions of the heat pipe and the thermal fins of the conventional heat dissipation module are constrained by mechanical space, resulting in small area where the heat pipe contacts the thermal fins. The thermal fins with an inclined shape or an arc shape are designed to be contacts the heat pipe for solving above drawbacks. However, the above-mentioned design for increasing the area where the heat pipe contacts the thermal fins results in non-identical gaps between the fan and the thermal fins. Thus, it results in turbulent flow of the air, which generates in noises, so as to reduce quality of product.

Furthermore, in order to satisfy a trend of the consumer electronic device towards a small size, it is designed that the gap between the thermal fins and the fan is reduced for reducing the volume of the heat dissipation module. Since the fan is close to the thermal fins, the above-mentioned design results in more noises when the fan flows the air to the thermal fins, and thus reduces the quality of product. Alternatively, it is designed that a length of each blade of the fan is reduced for reducing the volume of the heat dissipation module. However, it causes that an active area of each blade of the fan for flowing the air is curtailed, and thus reduces the convection effect between the thermal fins and the air. Accordingly, it will reduce the heat dissipating efficiency of the heat dissipation module. Thus, how to design a heat dissipation module capable of enhancing heat dissipating efficiency and reducing noise and an electronic device therewith has been an issue of mechanical design for the consumer electronic product.

SUMMARY OF THE INVENTION

The present invention provides a heat dissipation module capable of enhancing heat dissipating efficiency and reducing noise and an electronic device therewith for solving above drawbacks.

According to an embodiment, a heat dissipation module adapted to an electronic device includes a fan. The fan includes a fan body, a plurality of blade units and a plurality of blade extensions. The plurality of blade units is connected to the fan body. The plurality of blade extensions respectively protrudes from the plurality of blade units. A first surface is formed on a side of each of the plurality of blade extensions. A distance between the first surface and an axis of the fan body is increasing along an inflow direction. The heat dissipation module further includes a thermal fin portion disposed on a side of the fan. The thermal fin portion includes a plurality of fin units and a plurality of fin extensions. The plurality of fin extensions respectively protrudes from the plurality of fin units. A second surface is formed on a side of each of the plurality of fin extensions facing the corresponding blade extension, and an identical gap is formed between at least one portion of the first surface and at least one portion of the second surface.

According to another embodiment, the identical gap is formed between an end portion of the first surface and an end portion of the second surface.

According to another embodiment, a distance measured at a height along a direction perpendicular to the inflow direction between the first surface and the second surface is substantially identical to another distance measured at another height along the direction perpendicular to the inflow direction between the first surface and the second surface.

According to another embodiment, the heat dissipation module further includes a flow channel structure disposed near a periphery of the fan for guiding air flowed from the fan to the thermal fin portion.

According to another embodiment, an internal surface is formed on the flow channel structure, and an identical gap is formed between the internal surface and the first surface.

According to another embodiment, the first surface is an arc-shaped plane.

According to another embodiment, the first surface is an inclined plane.

According to another embodiment, the fan is a centrifugal fan.

According to another embodiment, an electronic device includes at least one heat pipe and a heat dissipation module for dissipating heat transmitted from the at least one heat pipe. The heat dissipation module includes a fan. The fan includes a fan body, a plurality of blade units and a plurality of blade extensions. The plurality of blade units is respectively connected to the fan body. The plurality of blade extensions respectively protrudes from the plurality of blade units. A first surface is formed on a side of each of the plurality of blade extensions. A distance between the first surface and an axis of the fan body is increasing along an inflow direction. The heat dissipation module further includes a thermal fin portion disposed on a side of the fan. The thermal fin portion includes a plurality of fin units and a plurality of fin extensions. The plurality of fin extensions respectively protrudes from the plurality of fin units. A second surface is formed on a side of each of the plurality of fin extensions facing the corresponding blade extension, and an identical gap is formed between at least one portion of the first surface and at least one portion of the second surface.

According to another embodiment, the at least one heat pipe includes a first section and a second section. The first section is supported by the thermal fin portion. The second section is connected to the first section and surrounds a portion of the fan.

According to another embodiment, the first section is a linear structure, and the second section is a semi-circular structure.

In summary, the present invention utilizes the distance between the first surface of each of the blade extensions and the axis of the fan body to be increasing along the inflow direction and the fan to be a centrifugal fan for enhancing heat dissipating efficiency. In addition, the present invention further utilizes the identical gap being formed between the at least one portion of the first surface and the at least one portion of the second surface for reducing turbulent flow of air generated by the running fan, so as to reduce noise generated by the turbulent flow of the air. As a result, the heat dissipation module of the present invention can not only enhance the heat dissipating efficiency, but also reduce the noise generated by the running fan.

These and other objectives of the present invention will no doubt become obvious to those of ordinary skill in the art after reading the following detailed description of the embodiment that is illustrated in the various figures and drawings.

DETAILED DESCRIPTION

Figure 1:
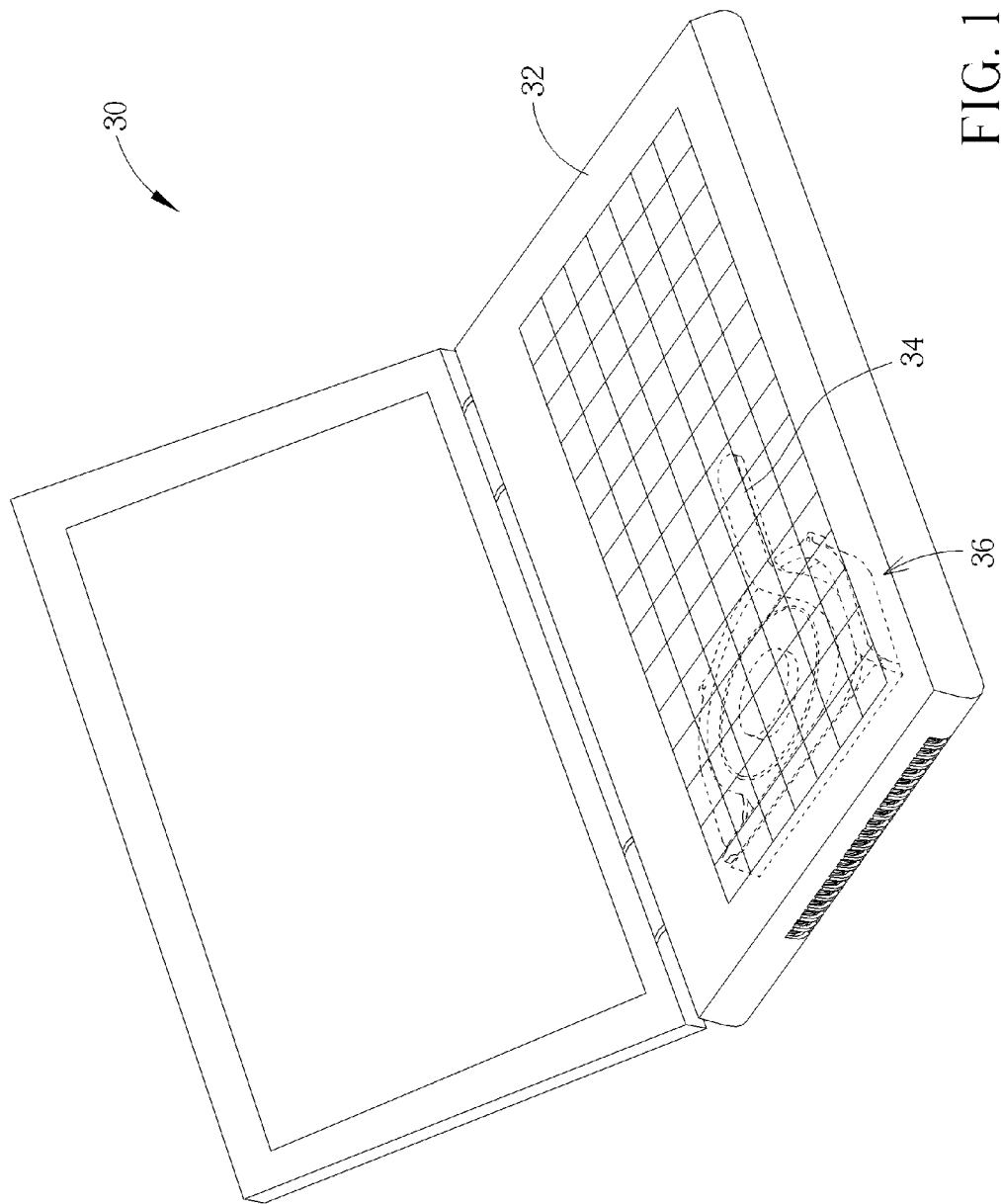
FIG. 1 is a diagram of an electronic device according to an embodiment of the present invention.

Please refer to FIG. 1. FIG. 1 is a diagram of an electronic device 30 according to an embodiment of the present invention. As shown in FIG. 1, the electronic device 30 includes a casing 32, a heat pipe 34 and a heat dissipation module 36. The casing 32 covers internal electronic components of the electronic device 30, such as a main board, a hard disk drive and so on, so as to prevent the internal electronic components of the electronic device 30 from collision and damage. When the electronic device 30 is in use, the heat pipe 34 transmits heat generated by the running internal electronic components of the electronic device 30 to the heat dissipation module 36, such that the heat dissipation module 36 dissipates the heat transmitted from the heat pipe 34. Accordingly, it can cool the running electronic device 30 and further prevent the electronic device 30 from functioning abnormally due to high temperature.

In this embodiment, the electronic device 30 can include one heat pipe 34. An amount of the heat pipe 34 is not limited to that mentioned in this embodiment. For example, the electronic device 30 can include two or three heat pipes, so as to effectively transmit the heat generated by the running internal electronic components of the electronic device 30 to the heat dissipation module 36. In other words, the structural design of the electronic device 30 with the at least one heat pipe 34 is within the scope of the present invention. In addition, the electronic device 30 can be, but not limited to, a notebook computer. For example, the electronic device 30 can be a server computer or a desk-top computer as well.

Figure 2:
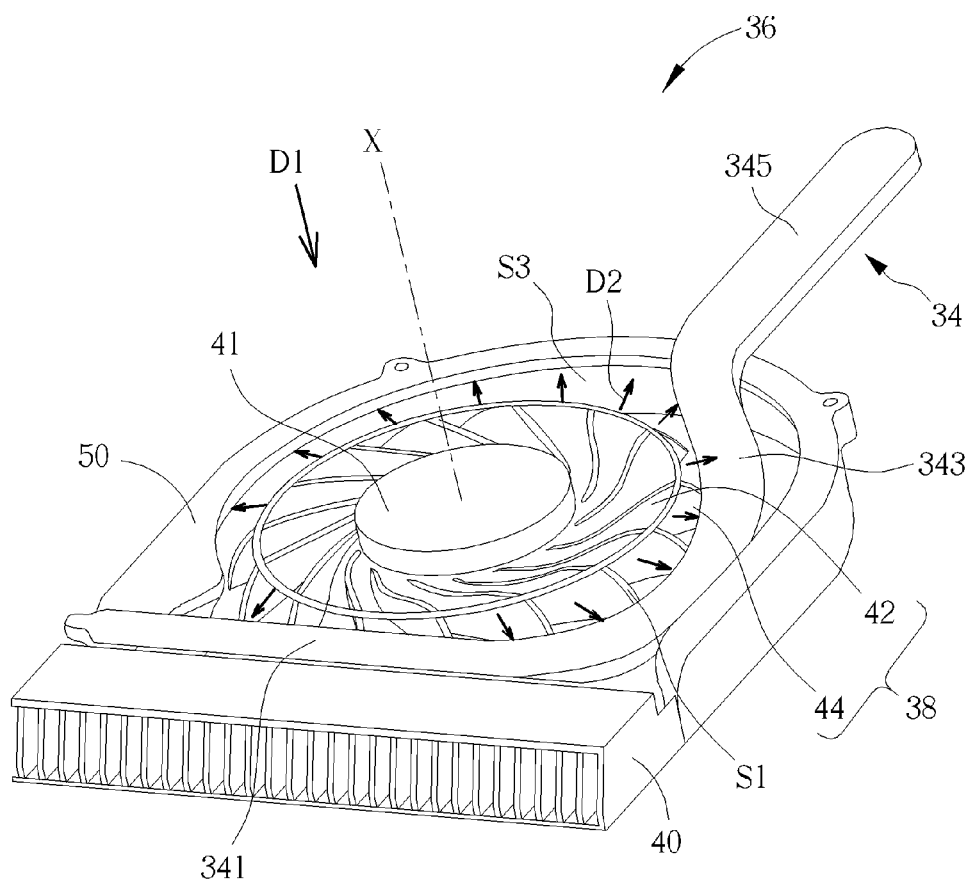
FIG. 2 is a diagram of a heat dissipation module according to the embodiment of the present invention.

Please refer to FIG. 1 and FIG. 2. FIG. 2 is a diagram of the heat dissipation module 36 according to the embodiment of the present invention. As shown in FIG. 1 and FIG. 2, the heat dissipation module 36 includes a fan 38 and a thermal fin portion 40. In this embodiment, the heat pipe 34 includes a first section 341, a second section 343 and a third section 345. The first section 341 is supported by the thermal fin portion 40. The second section 343 is connected to the first section 341 and surrounds a portion of the fan 38. The third section 345 is connected to the internal electronic components of the electronic device 30. As mentioned above, the heat generated by the running internal electronic components of the electronic device 30 is transmitted to the thermal fin portion 40 via the third section 345, the second section 343 and the first section 341 in sequence.

As shown in FIG. 2, the first section 341 can be a linear structure, and the second section 343 can be a semi-circular structure. Structures of the first section 341 and the second section 343 are not limited to those mentioned in this embodiment. For example, the first section 341 can be a structure with a shape corresponding to an arrangement of the thermal fin portion 40, and the second section 343 can be a U-shaped structure. In other words, the structures of the first section 341 and the second section 343 capable of surrounding the portion of the fan 38 are within the scope of the present invention.

Furthermore, the fan 38 is installed inside the casing 32 of the electronic device 30 for convecting air inside the casing 32, so as to dissipate the heat transmitted to the heat dissipation module 36. The thermal fin portion 40 is disposed on a side of the fan 38 for increasing surface of the heat dissipation module 36 for contacting the air, so as to enhance heat dissipating efficiency of the heat dissipation module 36. In this embodiment, the fan 38 can be a centrifugal fan which draws the air from an external side of the heat dissipation module 36 along an inflow direction D1 shown in FIG. 2, i.e. in a downward direction, and emits the drawn air to the thermal fin portion 40 disposed on the side of the fan 38 along an outflow direction D2 perpendicular to the inflow direction D1, i.e. in a radial direction of the fan 38. Accordingly, the air inside the casing 32 convects for dissipating the heat transmitted to the thermal fin portion 40.

Figure 3:
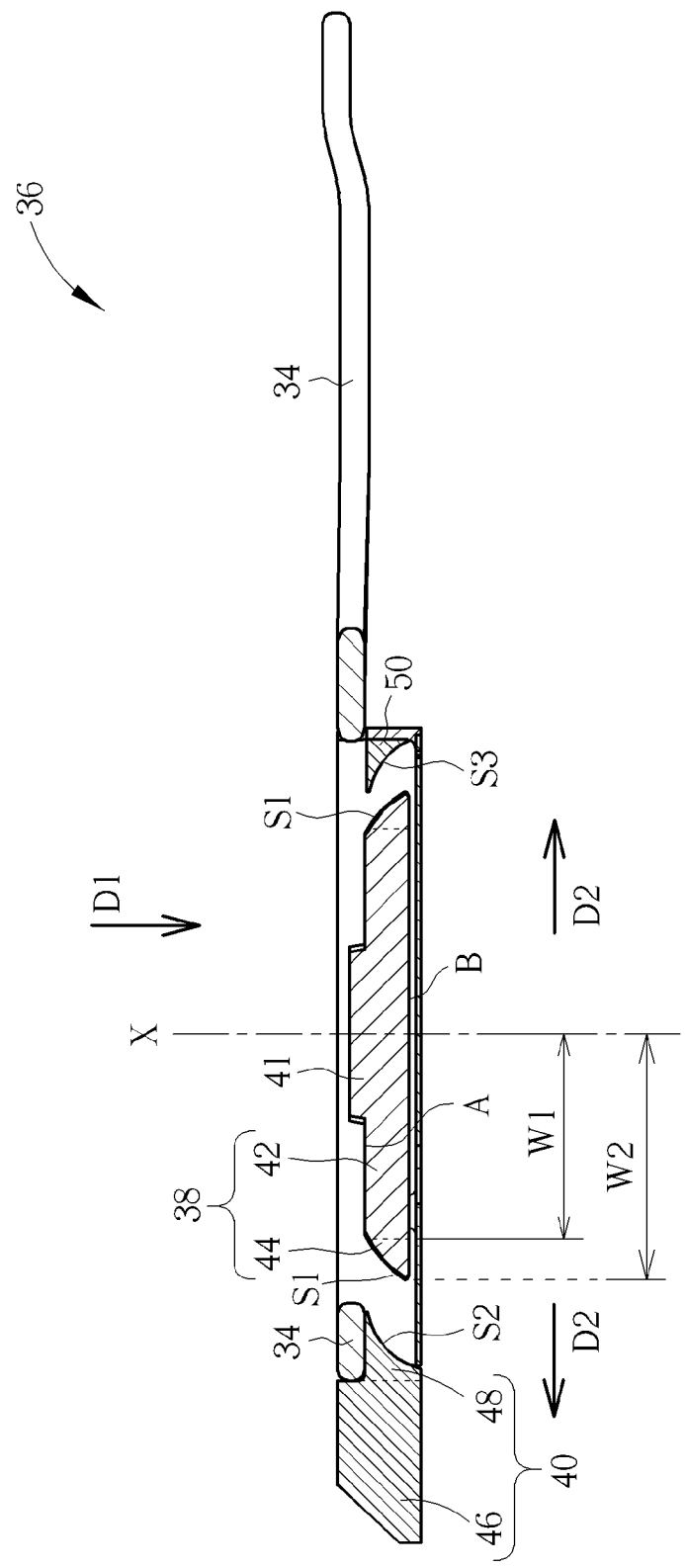
FIG. 3 is a sectional diagram of the heat dissipation module according to the embodiment of the present invention.

Please refer to FIG. 2 and FIG. 3. FIG. 3 is a sectional diagram of the heat dissipation module 36 according to the embodiment of the present invention. As shown in FIG. 2 and FIG. 3, the fan 38 includes a fan body 41, a plurality of blade units 42 and a plurality of blade extensions 44. When the fan 38 functions, each of the blade units 42 is driven to rotate relative to an axis X of the fan body 41 of the fan 38, so as to emit the air drawn along the inflow direction D1 to the thermal fin portion 40 along the outflow direction D2. In this embodiment, the inflow direction D1 can be substantially perpendicular to the outflow direction D2. The plurality of blade extensions 44 respectively extrude from the plurality of blade units 42 for facilitating the blade units 42 to emit the air to the thermal fin portion 40, so as to further enhance the heat dissipating efficiency of the heat dissipation module 36.

Furthermore, a first surface S1 is formed on a side of each of the plurality of blade extensions 44. In this embodiment, the first surface S1 can be an arc-shaped plane, and a distance between the first surface S1 and the axis X of the fan body 41 is increasing along the inflow direction D1. In other words, a width W1 of a side of each of the blade extensions 44 is increasing to a width W2 of another side of each of the blade extensions 44 along the inflow direction D1, as shown in FIG. 3. In summary, the first surface S1 of each of the blade extensions 44 is an arc-shaped plane with notch downward.

In practical application, the aforesaid air for convection is drawn from a top side A of the blade units 42 to the heat dissipation module 36 in the inflow direction D1. When the air achieves a bottom side B of the blade units 42, the blade units 42 fan the air, so as to emit the air to the thermal fin portion 40 in the outflow direction D2. Accordingly, efficiency which the bottom side B of the blade units 42 fans the air to the thermal fin portion 40 in the outflow direction D2 is better than efficiency which the top side A of the blade units 42 fans the air. In other words, a width of the blade extension 44, i.e. a distance between a side of the first surface S1 and the opposite side of the first surface S1, can be practically designed to curtail the width of the blade extension 44 close to the top side A of the blade unit 42, which fans less effectively, and to further keep the width of the blade extension 44 close to the bottom side B of the blade unit 42. Accordingly, it can keep quantity of air emitted by the fan 38 for enhancing the heat dissipating efficiency of the fan 38.

In addition, the thermal fin portion 40 includes a plurality of fin units 46 and a plurality of fin extensions 48. The plurality of fin extensions 48 are used for increasing the area of the heat dissipation module 36 for heat dissipation. The plurality of fin extensions 48 respectively protrude from the plurality of fin units 46 for supporting the heat pipe 34. Accordingly, the heat transmitted from the heat pipe 34 can be transmitted to the corresponding each of the fin units 46 by the corresponding fin extension 48, and the plurality of fin units 46 dissipate the heat by convention resulting from the air emitted by blade extensions 44 of the fan 38 and by the blade units 42 of the fan 38. Structures for supporting the heat pipe 34 are not limited to those mentioned in this embodiment. For example, the heat pipe 34 can be supported by the fin units 46 of the thermal fin portion 40. In other words, the structures included by the thermal fin portion 40 can be used for supporting the heat pipe 34.

Furthermore, a second surface S2 is formed on a side of each of the plurality of fin extensions 48 facing the corresponding blade extension 44, and a shape of the second surface S2 corresponds to the shape of the first surface S1. In other words, the shape of the second surface S2 is an arc-shaped plane with notch downward. As mentioned above, an identical gap can be formed between the first surface S1 of the blade extension 44 and the second surface S2 of the fin extension 48. In other words, an identical gap is formed between the first surface S1 of the blade extension 44 and the second surface S2 of the fin extension 48 along the outflow direction D2 perpendicular to the inflow direction D1, i.e. a distance measured at a height along the outflow direction D2 between the first surface S1 and the second surface S2 is substantially identical to another distance measured at another height along the outflow direction D2 between the first surface S1 and the second surface S2. When the air is fanned by the blade units 42 and the blade extensions 44 and emitted from the first surfaces S1 of the blade extensions 44 to the second surfaces S2 of the fin extensions 48, the air passes through the same distance due to the structural design of the identical gap, so as to effectively reduce turbulent flow of the air and further decrease noise generated by the turbulent flow. In summary, the present invention of the heat dissipation module 36 can reduce the noise as functioning.

In practical application, it can be designed for facilitating manufacture that the identical gap is formed between at least one portion of the first surface S1 of the blade extensions 44 and at least one portion of the second surface S2 of the fin extension 48. In this embodiment, the identical gap can be formed between an end portion of the first surface S1 and an end portion of the second surface S2. In summary, the design that the identical gap is formed between at least one portion of the first surface S1 of the blade extensions 44 and at least one portion of the second surface S2 of the fin extension 48, instead of design that the identical gap is substantially formed between the whole portion of the first surface S1 of the blade extensions 44 and the whole portion of the second surface S2 of the fin extension 48, has advantage of simple structure. Accordingly, it can save labor hours and reduce a certain level of noise.

As mentioned above, since the efficiency which the bottom side B of the blade unit 42 fans the air is better than efficiency which the top side A of the blade unit 42 does, the present invention is practically designed that the identical gap is formed between the portion of the first surface S1 corresponding to the bottom side B of the blade unit 42 and the portion of the second surface S2 corresponding to the bottom side B of the blade units 42. It has advantages of maintaining air emission quantity of the fan 38, reducing the noise and greatly decreasing manufacture costs.

It should be noticed that the identical gap between the first surface S1 and the second surface S2 is not limited to the position corresponding to the bottom side B of the blade unit 42, as mentioned in this embodiment. The identical gap can be formed between a portion of the first surface S1 corresponding to other part of the blade unit 42 and a portion of the second surface S2 corresponding to other part of the blade unit 42. In other words, the structural design that a difference between two gaps respectively between the first surface S1 and the second surface S2 along the direction perpendicular to the inflow direction D1, i.e. the outflow direction D2, is smaller than a predetermined value is within the scope of the present invention.

As shown in FIG. 2 and FIG. 3, the heat dissipation module 36 can further include a flow channel structure 50 disposed near a periphery of the fan 38. The flow channel structure 50 is used for guiding the air flowed from the fan 38 along the outflow direction D2 to the thermal fin portion 40. As mentioned above, the flow channel structure 50 is used for centralizing the air flowed from the fan 38 and emitting the centralized air to the thermal fin portion 40, so as to enhance the convection effect. Accordingly, it can enhance the heat dissipating efficiency of the heat dissipation module 36.

In addition, an internal surface S3 is formed on the flow channel structure 50 with a shape corresponding to the shape of the first surface S1 on the blade extension 44, as shown in FIG. 3. An identical gap is formed between the internal surface S3 on the flow channel structure 50 and the first surface S1 on the blade extension 44, so as to reduce the noise of the running heat dissipation module 36. The principle for reducing the noise and saving costs is similar to the identical gap between the first surface S1 and the second surface S2, and further description is omitted herein for simplicity.

Figure 4:
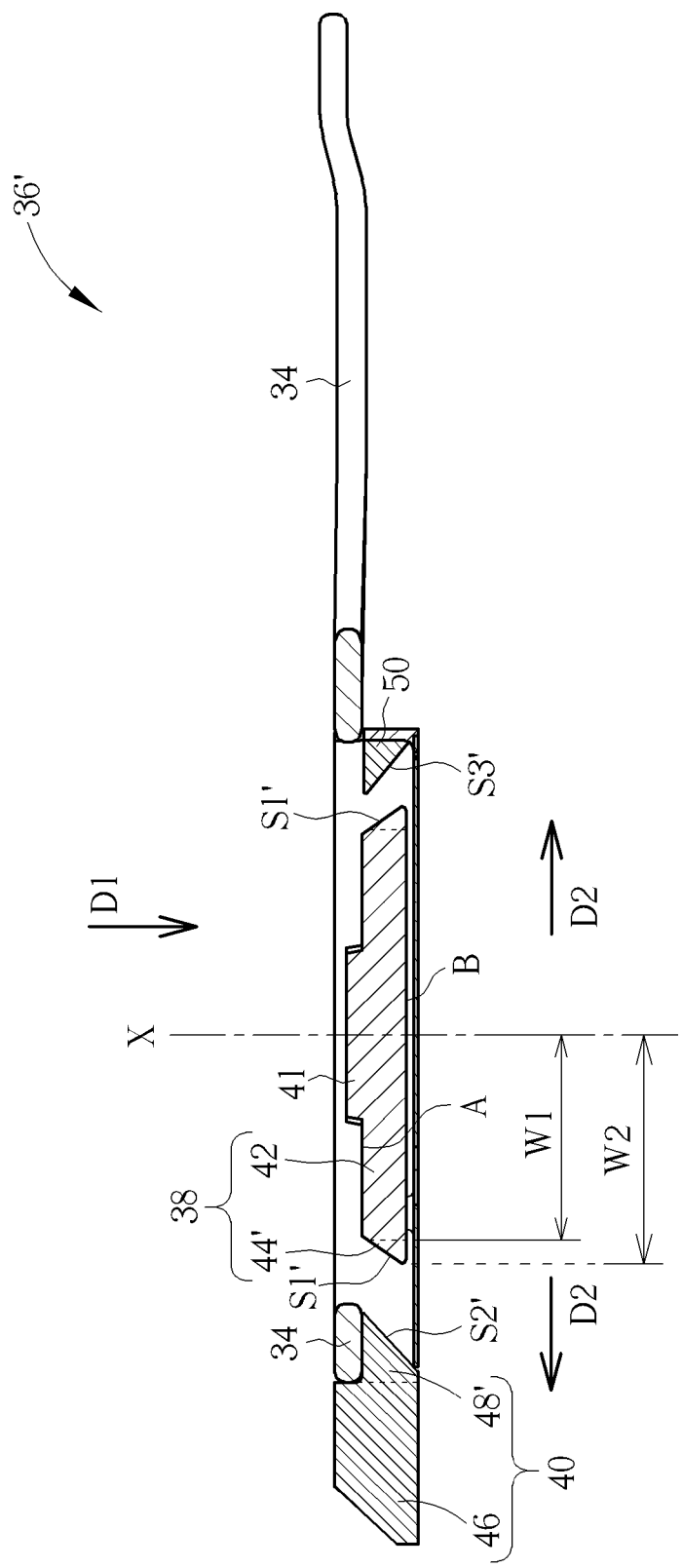
FIG. 4 is a sectional diagram of a heat dissipation module according to another embodiment of the present invention.

Please refer to FIG. 4. FIG. 4 is a sectional diagram of a heat dissipation module 36' according to another embodiment of the present invention. As shown in FIG. 4, a major difference between the heat dissipation module 36' and the aforesaid heat dissipation module 36 is that a first surface S1' on a blade extension 44' of the heat dissipation module 36' is an inclined plane. As mentioned above, a second surface S2' on a fin extension 48' of the heat dissipation module 36' and an internal surface S3' on a flow channel structure 50' are respectively an inclined plane. Additionally, a distance between the first surface S1' on the blade extension 44' and the axis of the fan body 41 is increasing along the inflow direction D1, so as to enhance the heat dissipating efficiency. Furthermore, an identical gap is formed between the first surface S1' and the second surface S2', so as to reduce the noise of the running heat dissipation module 36'. The principle for reducing the noise and saving costs is similar to the identical gap between the first surface S1 and the second surface S2, and further description is omitted herein for simplicity. The components with identical denotes between this embodiment and the aforesaid embodiment have the same structures and principles, and further description is omitted herein for simplicity. The first surface on the blade extension, the second surface on the fin extension and the internal surface of the flow channel structure of the present invention are not limited to those mentioned in this embodiment. The structural designs with identical gap between the first surface and the second surface or with identical gap between the first surface and the internal surface are within the scope of the present invention.

Compared to the prior art, the width of the blade extension, i.e. the distance between the side of the first surface of the blade extension and the other side of the blade extension, of the present invention is designed that the width of the top side of the blade extension with poorer efficiency is curtailed, and the width of the bottom side of the blade extension with better efficiency is further kept. Accordingly, it can keep quantity of the air emitted from the fan as well as enhance the heat dissipating efficiency of the fan. In addition, the present invention further utilizes the design that the identical gap is formed between the at least one portion of the first surface and the at least one portion of the second surface for reducing the turbulent flow of the air generated by the running fan, so as to reduce the noise generated by the turbulent flow of the air. As a result, the heat dissipation module of the present invention cannot only enhance the heat dissipating efficiency, but also reduce the noise generated by the running fan.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat dissipation module adapted to an electronic device, the heat dissipation module comprising:
　a fan comprising:
　　a fan body;
　　a plurality of blade units connected to the fan body; and
　　a plurality of blade extensions respectively protruding from the plurality of blade units, a first surface being formed on a side of each of the plurality of blade extensions, a distance between the first surface and an axis of the fan body being increasing along an inflow direction; and
　a thermal fin portion disposed on a side of the fan, the thermal fin portion comprising:
　　a plurality of fin units; and
　　a plurality of fin extensions respectively protruding from the plurality of fin units, a second surface being formed on a side of each of the plurality of fin extensions and facing the corresponding first surface of the blade extension, and a distance between the second surface and the axis of the fan body being increasing along the inflow direction, such that an identical gap being formed between at least one portion of the first surface and at least one portion of the second surface.

2. The heat dissipation module of claim 1, wherein the identical gap is formed between an end portion of the first surface and an end portion of the second surface.

3. The heat dissipation module of claim 1, wherein a distance measured at a height along a direction perpendicular to the inflow direction between the first surface and the second surface is substantially identical to another distance measured at another height along the direction perpendicular to the inflow direction between the first surface and the second surface.

4. The heat dissipation module of claim 1, further comprising a flow channel structure disposed near a periphery of the fan for guiding air flowed from the fan to the thermal fin portion.

5. The heat dissipation module of claim 4, wherein an internal surface is formed on the flow channel structure, and an identical gap is formed between the internal surface and the first surface.

6. The heat dissipation module of claim 1, wherein the first surface is an arc-shaped plane.

7. The heat dissipation module of claim 1, wherein the first surface is an inclined plane.

8. The heat dissipation module of claim 1, wherein the fan is a centrifugal fan.

9. An electronic device, comprising:
　at least one heat pipe; and
　a heat dissipation module for dissipating heat transmitted from the at least one heat pipe, the heat dissipation module comprising:
　　a fan comprising:
　　　a fan body;
　　　a plurality of blade units respectively connected to the fan body; and
　　　a plurality of blade extensions protruding from the plurality of blade units, a first surface being formed on a side of each of the plurality of blade extensions, a distance between the first surface and an axis of the fan body being increasing along an inflow direction; and
　　a thermal fin portion disposed on a side of the fan, the thermal fin portion comprising:
　　　a plurality of fin units; and
　　　a plurality of fin extensions respectively protruding from the plurality of fin units, a second surface being formed on a side of each of the plurality of fin extensions and facing the corresponding first surface of the blade extension, and a distance between the second surface and the axis of the fan body being increasing along the inflow direction, such that an identical gap being formed between at least one portion of the first surface and at least one portion of the second surface.

10. The electronic device of claim 9, wherein the identical gap is formed between an end portion of the first surface and an end portion of the second surface.

11. The electronic device of claim 9, wherein a distance measured at a height along a direction perpendicular to the inflow direction between the first surface and the second surface is substantially identical to another distance measured at another height along the direction perpendicular to the inflow direction between the first surface and the second surface.

12. The electronic device of claim 9, further comprising a flow channel structure disposed near a periphery of the fan for guiding air flowed from the fan to the thermal fin portion.

13. The electronic device of claim 12, wherein an internal surface is formed on the flow channel structure, and an identical gap is formed between the internal surface and the first surface.

14. The electronic device of claim 9, wherein the first surface is an arc-shaped plane.

15. The electronic device of claim 9, wherein the first surface is an inclined plane.

16. The electronic device of claim 9, wherein the at least one heat pipe comprises:
　a first section supported by the thermal fin portion; and
　a second section connected to the first section and surrounding a portion of the fan.

17. The electronic device of claim 16, wherein the first section is a linear structure, and the second section is a semi-circular structure.

18. The electronic device of claim 9, wherein the fan is a centrifugal fan.

* * * * *